(12) United States Patent
Mundrake (10) Patent No.: US 9,671,824 B2
(45) Date of Patent: Jun. 6, 2017

(54) SYSTEM AND METHOD FOR PROTECTING A DISPLAY SCREEN OF A DISPLAY MONITOR

(71) Applicant: Gary Douglas Mundrake, Centerville, MD (US)

(72) Inventor: Gary Douglas Mundrake, Centerville, MD (US)

(*) Notice: Subject to any disclaimer, the term of this patent is extended or adjusted under 35 U.S.C. 154(b) by 0 days.

(21) Appl. No.: 14/844,142

(22) Filed: Sep. 3, 2015

(65) Prior Publication Data

US 2017/0071070 A1    Mar. 9, 2017

(51) Int. Cl.
*G06F 1/16* (2006.01)
*H05K 5/03* (2006.01)
*H05K 5/00* (2006.01)

(52) U.S. Cl.
CPC .......... *G06F 1/1609* (2013.01); *G06F 1/1601* (2013.01); *G06F 1/1603* (2013.01); *H05K 5/0004* (2013.01); *H05K 5/0017* (2013.01); *H05K 5/03* (2013.01)

(58) Field of Classification Search
CPC .... G06F 1/1601; G06F 1/1603; G06F 1/1609; H05K 5/0004; H05K 5/0017; H05K 5/03
USPC .................................................... 361/679.24
See application file for complete search history.

(56) References Cited

U.S. PATENT DOCUMENTS

| | | | |
|---|---|---|---|
| 4,992,881 A | 2/1991 | Tomasek et al. | |
| 6,125,525 A | 10/2000 | Brock | |
| 6,377,320 B1 | 4/2002 | Ananian et al. | |
| 6,469,752 B1* | 10/2002 | Ishikawa | G06F 1/1609 |
| | | | 348/823 |
| 8,416,350 B2 | 4/2013 | Tsanev et al. | |
| 8,514,364 B2* | 8/2013 | Mikubo | G02F 1/133308 |
| | | | 349/161 |
| 8,885,110 B1 | 11/2014 | St. Clair | |
| 9,097,382 B1 | 8/2015 | Leech et al. | |
| 2004/0109096 A1* | 6/2004 | Anderson | C09J 7/0207 |
| | | | 348/832 |
| 2004/0178312 A1* | 9/2004 | Parsons | A61G 15/10 |
| | | | 248/276.1 |

(Continued)

FOREIGN PATENT DOCUMENTS

| | | |
|---|---|---|
| CA | 2652916 A1 | 8/2010 |
| EP | 1672921 A1 | 6/2006 |

*Primary Examiner* — Nidhi Thaker
(74) *Attorney, Agent, or Firm* — Panitch Schwarze Belisario & Nadel LLP (57) ABSTRACT

A system for protecting a display screen of a display monitor is disclosed. The system includes a protective transparent panel, and a retention bezel. The protective transparent panel has an inner panel portion surrounded by an outer peripheral panel portion. The inner panel portion has a panel area equal to the screen viewing area, and an outer peripheral panel portion extending outwardly of the inner panel portion to overlay the monitor bezel. The retention bezel has a mounting portion and a front flange portion. The mounting portion is sized to encircle the protective transparent and the monitor housing, and the mounting portion extends rearwardly to overlay the monitor housing. The front flange portion overlays the outer peripheral panel portion, and has an inward width of between 0.1 mm and 5 mm. The mounting portion and the front flange portion have a material thickness of less than 5 mm.

17 Claims, 8 Drawing Sheets

(56) References Cited

U.S. PATENT DOCUMENTS

| | | | | |
|---|---|---|---|---|
| 2004/0227722 A1* | 11/2004 | Friberg | ............... | G06F 1/1609 |
| | | | | 345/156 |
| 2007/0030633 A1* | 2/2007 | Tseng | ................... | G06F 1/1609 |
| | | | | 361/679.24 |
| 2009/0225506 A1* | 9/2009 | Lee | ..................... | H05K 5/0017 |
| | | | | 361/679.21 |
| 2009/0262423 A1* | 10/2009 | Kitazume | ......... | H05K 7/20181 |
| | | | | 359/511 |
| 2010/0014239 A1* | 1/2010 | Sassounian | .......... | G06F 1/1601 |
| | | | | 361/679.26 |
| 2010/0025869 A1 | 2/2010 | Suzuishi et al. | | |
| 2013/0135804 A1* | 5/2013 | Takechi | ........... | G02F 1/133308 |
| | | | | 361/679.01 |
| 2014/0063705 A1* | 3/2014 | Song | .................. | H04M 1/0266 |
| | | | | 361/679.01 |

\* cited by examiner

SYSTEM AND METHOD FOR PROTECTING A DISPLAY SCREEN OF A DISPLAY MONITOR

FIELD

This disclosure relates to the field of systems and methods for protecting a display screen of a display monitor, and to display walls.

INTRODUCTION

Display monitors may be used in applications which expose the display screen of the display monitor to potential harm. A protective cover may be applied to the display screen to protect the display screen.

SUMMARY

In a first aspect, a system for protecting a display screen of a display monitor is disclosed. The display screen has a screen viewing area. The display monitor includes a monitor bezel encircling the screen viewing area, and a monitor housing extending rearwardly of the monitor bezel. The system comprises a protective transparent panel, and a retention bezel. The protective transparent panel has an inner panel portion surrounded by an outer peripheral panel portion. The inner panel portion has a panel area equal to the screen viewing area. The outer peripheral panel portion extends outwardly of the inner panel portion to overlay the monitor bezel. The retention bezel has a mounting portion and a front flange portion. The mounting portion is sized to encircle the protective transparent and the monitor housing, and the mounting portion extends rearwardly from a mounting portion front end to overlay the monitor housing. The front flange portion extends inwardly from the mounting portion front end to overlay the outer peripheral panel portion, and has an inward width of between 0.1 mm and 5 mm. The mounting portion and the front flange portion having a material thickness of less than 5 mm.

In some embodiments, the monitor housing may be substantially rectangular with four connected housing sides, and the retention bezel is substantially rectangular, the mounting portion including four connected mounting portion sides sized to extend rearwardly over the four housing sides.

In some embodiments, the mounting portion may include a plurality of fastener apertures collectively distributed to align with at least two of the four housing sides.

In some embodiments, the retention bezel may further comprise a spacer connected to an inside face of the mounting portion and spaced rearwardly of the front flange.

In some embodiments, the spacer may have a rearward depth of between 6 mm and 48 mm.

In some embodiments, the retention bezel may further comprise a retention slot sized to receive the outer peripheral panel portion.

In some embodiments, the retention bezel may comprise a plurality of linear retention bezel segments, and each retention bezel segment may include a corresponding front flange portion segment integrally formed with a mounting portion segment.

In some embodiments, each retention bezel segment may be formed from sheet metal, and for each retention bezel segment, the front flange portion segment may be bent approximately 90 degrees inwardly from the mounting portion segment.

In another aspect, a method of protecting a display screen of a display monitor is disclosed. The display screen has a screen viewing area. The display monitor includes a monitor bezel encircling the screen viewing area, and a monitor housing extending rearwardly of the monitor bezel. The method may comprise overlaying the display screen and the monitor bezel with a protective transparent panel, the transparent panel having an inner panel portion surrounded by an outer panel portion, the inner panel portion overlaying the entire screen viewing area, and the outer panel portion overlaying the monitor bezel; overlaying the monitor bezel, the outer panel portion, and the monitor housing with a retention bezel, the retention bezel having a mounting portion extending from a mounting portion front end rearwardly over the monitor housing, and a front flange portion, the mounting portion encircling the protective transparent and the mounting monitor housing, the front flange portion extending inwardly from the mounting portion front end by between 0.1 mm to 5 mm to overlay the monitor bezel and the outer panel portion, and the front flange portion positioned outwardly of the screen viewing area; and fastening the mounting portion to the monitor bezel.

In some embodiments, the monitor may be substantially rectangular with four connected housing sides, and said fastening comprises inserting at least one fastener inwardly into each of the housing sides.

In some embodiments, the retention bezel may further comprise a spacer defining a retention slot with the front flange portion, and said overlaying the monitor bezel, the outer panel portion, and the monitor housing may comprise receiving the outer panel portion in the retention slot.

In some embodiments, the method may further comprise inserting plurality of fasteners inwardly through the mounting portion into the spacer.

In some embodiments, said overlaying the monitor bezel, the outer panel portion, and the monitor housing may comprise abutting the monitor bezel with the spacer.

In some embodiments, the monitor housing may be substantially rectangular with four connected housing sides, and said overlaying the monitor bezel, the outer panel portion, and the monitor housing may comprise overlaying each of the housing sides with the mounting portion.

In another aspect, a display wall is provided. The display wall may comprise a plurality of display monitors arranged side-by-side in abutting relation, and a plurality of monitor protection systems. Each display monitor has a screen viewing area, a monitor bezel encircling the screen viewing area, and a monitor housing extending rearwardly of the monitor bezel. Each monitor protection system is mounted to a respective one of the plurality of display monitors. Each display monitor protection system comprises a protective transparent panel having an inner panel portion surrounded by an outer panel portion, the inner panel portion overlaying the entire screen viewing area of the respective display monitor, the outer peripheral panel portion overlaying the monitor bezel; and a retention bezel having a mounting portion extending from a mounting portion front end rearwardly over the monitor housing of the respective display monitor, and a front flange portion. The mounting portion encircles the protective transparent and the mounting monitor housing of the respective display monitor. The front flange portion extends inwardly 0.1 mm to 5 mm from the mounting portion front end over the outer panel portion, and the front flange portion is positioned outwardly of the screen viewing area. The mounting portion and the front flange portion have a material thickness of less than 5 mm.

In some embodiments, the monitor bezel of each display monitor may be substantially rectangular with four connected housing sides, and the retention bezel of each monitor protection system may be substantially rectangular. The mounting portion may include four connected mounting portion sides sized to extend rearwardly over the four housing sides of the respective display monitor.

In some embodiments, the mounting portion of the retention bezel of each monitor protection system may include a plurality of fastener apertures collectively distributed to align with at least two of the four housing sides of the respective display monitor.

In some embodiments, each display monitor may comprise a projected capacitive touch screen, and the retention bezel of each monitor protection system may further comprise a spacer separating the protective transparent panel of that monitor protection system from the projective capacity touch screen of the respective display monitor.

In some embodiments, the spacer has a rearward depth of between 6 mm and 48 mm.

In some embodiments, the retention bezel of each monitor protection system may comprise a plurality of linear retention bezel segments, and each retention bezel segment may include a corresponding front flange portion segment integrally formed with a mounting portion segment.

DESCRIPTION OF VARIOUS EMBODIMENTS

Numerous embodiments are described in this application, and are presented for illustrative purposes only. The described embodiments are not intended to be limiting in any sense. The invention is widely applicable to numerous embodiments, as is readily apparent from the disclosure herein. Those skilled in the art will recognize that the present invention may be practiced with modification and alteration without departing from the teachings disclosed herein. Although particular features of the present invention may be described with reference to one or more particular embodiments or figures, it should be understood that such features are not limited to usage in the one or more particular embodiments or figures with reference to which they are described.

The terms "an embodiment," "embodiment," "embodiments," "the embodiment," "the embodiments," "one or more embodiments," "some embodiments," and "one embodiment" mean "one or more (but not all) embodiments of the present invention(s)," unless expressly specified otherwise.

The terms "including," "comprising" and variations thereof mean "including but not limited to," unless expressly specified otherwise. A listing of items does not imply that any or all of the items are mutually exclusive, unless expressly specified otherwise. The terms "a," "an" and "the" mean "one or more," unless expressly specified otherwise.

As used herein and in the claims, two or more parts are said to be "coupled", "connected", "attached", or "fastened" where the parts are joined or operate together either directly or indirectly (i.e., through one or more intermediate parts), so long as a link occurs. As used herein and in the claims, two or more parts are said to be "directly coupled", "directly connected", "directly attached", or "directly fastened" where the parts are connected in physical contact with each other. As used herein, two or more parts are said to be "rigidly coupled", "rigidly connected", "rigidly attached", or "rigidly fastened" where the parts are coupled so as to move as one while maintaining a constant orientation relative to each other. None of the terms "coupled", "connected", "attached", and "fastened" distinguish the manner in which two or more parts are joined together.

Figure 1:
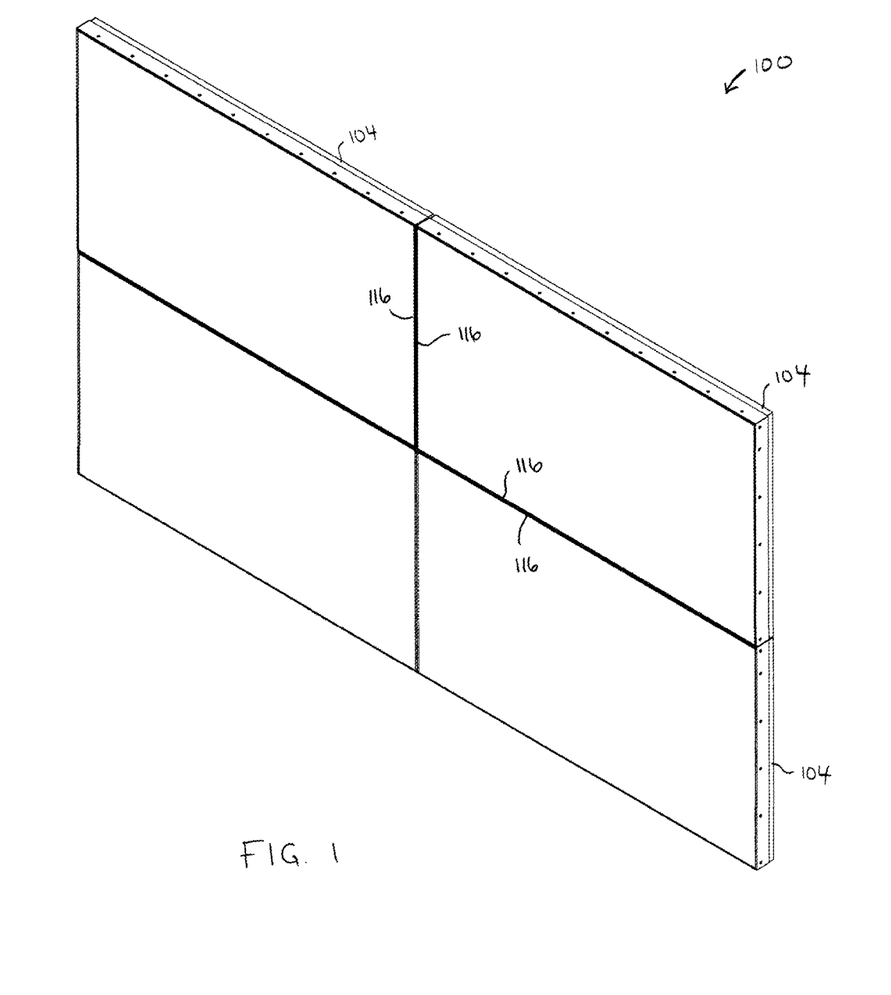
FIG. 1 is a perspective view of a display wall in accordance with at least one embodiment.

FIG. 1 shows a display wall 100, in accordance with at least one embodiment. As shown, display wall 100 may include a plurality of display monitors 104. Display monitors 104 may be arranged in an array, side-by-side, in any suitable layout. It will be appreciated that display monitors having diagonal dimensions over 100 inches may not be readily available or economically feasible. Instead, an image signal may be divided among a plurality of display monitors 104 forming a display wall 100, which may behave as one massive contiguous display monitor. Display wall 100 may be formed by display monitors 104 having favorable economies of scale to provide a massive combined display at an economical cost.

Display wall 100 may include any number of display monitors 104. For example, display wall 100 may include three or more display monitors 104, such as 4 to 100, 4 to 50, or 4 to 10 display monitors 104. In the illustrated example, display wall 100 includes four display monitors 104.

Display monitors 104 may have any suitable size. For example, each display monitor 104 may have a diagonal dimension of greater than 30", such as 36" to 84", 42" or 50" for example. Further, display monitors 104 of display wall 100 may be all the same size (e.g. diagonal dimension and aspect ratio) or display wall 100 may include display monitors of several different sizes.

Display monitors 104 may have any suitable shape. For example, each display monitor 104 may be rectangular as shown, square, circular, or another regular or irregular shape. Further, display monitors 104 of display wall 100 may be all the same shape, or display wall 100 may include display monitors of several different shapes.

Display monitors 104 may apply any suitable display technology. For example, display monitors 104 may be LCD, OLED, or plasma displays. Further, display monitors 104 of display wall 100 may all be of the same display technology, or display wall 100 may include display monitors of several different display technologies.

In some embodiments, display monitors 104 may be touch screens (e.g. responsive to physical interaction with the visible area of the display monitor 104) by any suitable touch screen technology. For example, display monitors 104 may include resistive, capacitive, infrared grid, optical imaging, or acoustic signal touch screen technology. In some examples, display monitors 104 are projected capacitive touch screens. Display monitors 104 of display wall 100 may all lack touch screen technology, may all include touch screen technology, or display wall 100 may include a mixture of touch screen and non-touch screen display monitors.

A display wall 100 may be applied to a variety of applications, such as advertising billboards and interactive touch exhibits. In some cases, display monitors 104 may be exposed to damage such as from physical interaction (e.g. human physical contact). For example, touch screen display monitors 104 forming an interactive touch exhibit may be exposed to physical interaction by exhibit participants. Display monitors 104 may have a protection system mounted thereto to defend against the risk of harm (e.g. from physical interaction).

Figure 2:
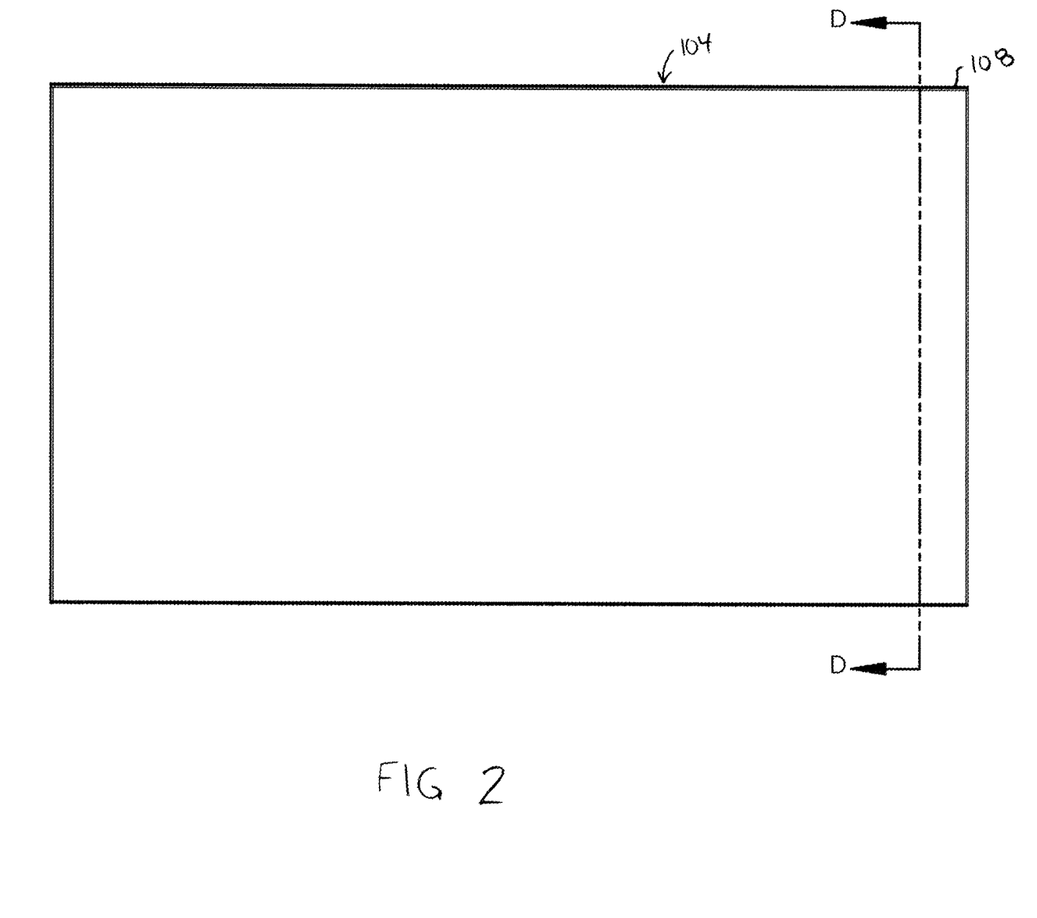
FIG. 2 is a front elevation view of a protected display monitor in accordance with at least one embodiment.
Figure 3:
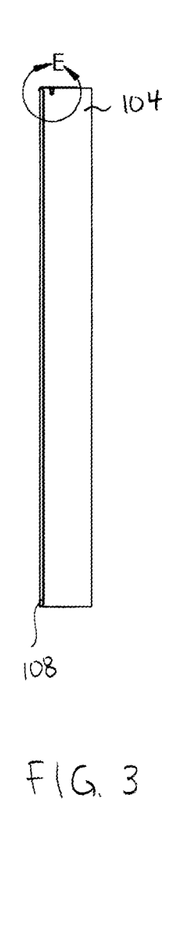
FIG. 3 is a cross-sectional view taken along line D-D in FIG. 2.
Figure 4:
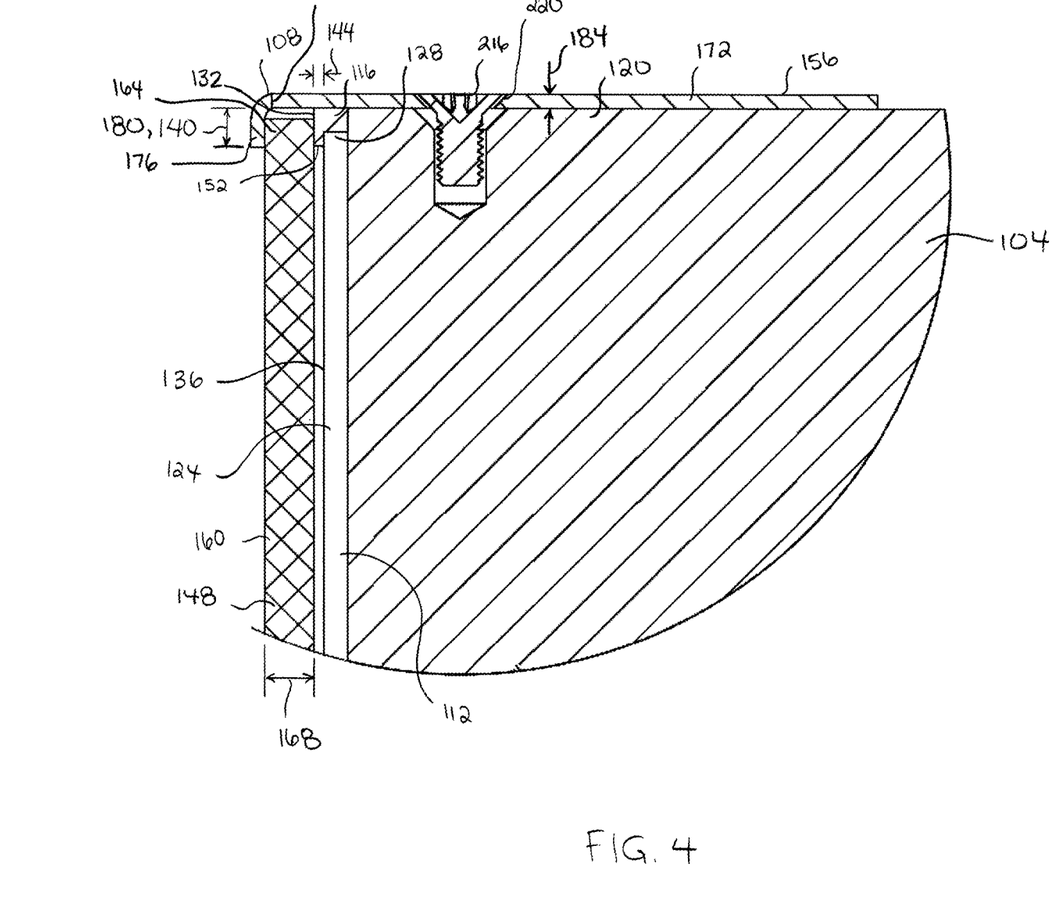
FIG. 4 is an enlarged view of region E of FIG. 3.

Reference is now made to FIGS. 2-4, which show a display monitor 104 having a protection system 108 mounted thereto. As shown in FIG. 4, display monitor 104 may include a display screen 112, a monitor bezel 116, and a monitor housing 120. Display screen 112 may include a screen viewing area 124 on or through which displayed images may be viewed. The screen viewing area 124 may constitute the entire display screen 112, or display screen 112 may further include a screen peripheral area 128 which extends outwardly of screen viewing area 124. As shown, screen peripheral area 128 may surround all or a portion of screen viewing area 124.

Still referring to FIG. 4, monitor bezel 116 may encircle at least screen viewing area 124 of display screen 112. For example, monitor bezel 116 may overlay screen peripheral area 128 forwardly of display screen 112. Monitor bezel 116 may positioned outward of screen viewing area 124 so as not to obstruct the visibility of images displayed on or through screen viewing area 124. As shown, monitor bezel 116 may have an inward monitor bezel width 140. Monitor bezel 116 may extend forwardly of display screen front face 136 by a forward monitor bezel thickness 144. Monitor housing 120 may extend rearwardly of the monitor bezel 116.

In alternative embodiments, monitor bezel 116 may encircle the entire display screen 112. This may permit monitor bezel front face 132 to align flush with display screen front face 136. In this case, the forward monitor bezel thickness 144 is nil. This may also permit screen viewing area 124 to constitute the entire display screen 112.

Referring now to FIGS. 1 and 4, monitor bezels 116 may visually disrupt the continuity of an image distributed across display monitors 104 of display wall 100. For example, monitor bezels 116 may appear as a grid of black lines in an illuminated billboard or interactive exhibit. Returning to FIG. 4, some older model display monitors had large bezels 116 with a monitor bezel width 140 and a monitor bezel thickness 144 each exceeding 10 mm. Such large bezels may permit a protected transparent panel 148 to be fastened to the monitor bezel 116. For example, the transparent panel 148 may be fastened by screws extending rearwardly through monitor bezel front face 132, or outwardly through monitor bezel inward face 152.

Recently, manufacturers have made progress in developing display monitors 104 with narrow monitor bezels 116. For example, some display monitors 104 have a monitor bezel width 140 of 5 mm or less, such as 0.1 mm to 5 mm, 0.1 mm to 3 mm, or less than 3 mm, and a monitor bezel thickness 144 of less than 5 mm, such as 0 mm to 5 mm, 0 mm to 3 mm, or 0 mm. Display monitors 104 with such small monitor bezels 116 help to reduce visual disruption when arranged in a display wall 100. However, such small monitor bezels 116 also make fastening a transparent panel 148 to the monitor bezel 116 infeasible. For example, the monitor bezel width 140 and the monitor bezel thickness 144 may not be large enough to support a suitable fastener.

In response, to the shrinking monitor bezels 116 of new model display monitors 104, protection systems have been developed that involve bonding (e.g. by adhesive) a transparent panel 148 directly to a display monitor. For example, the transparent panel 148 may be bonded to the monitor bezel front face 132 and/or the display screen front face 136. This may avoid the complication of mechanically fastening the transparent panel 148 to a tiny monitor bezel 116. However, display monitors 104 occasionally require service to repair damage or defects. In these instances, the OEM servicing the display monitor 104 typically requires the owner to remove the transparent panel 148. Debonding the transparent panel 148 can be labor intensive. Also, changes to the manufacturing process for modern narrow bezel monitors means that debonding the transparent panel frequently damages the display monitor 104 and sometimes the transparent panel 148. Re-bonding a transparent panel 148 to a repaired display monitor 104 can also be labor intensive and expensive. Moreover, the time to debond and rebond the display monitor can add delay to the repair cycle. A display wall may be rendered effectively inoperative (or unuseful) until a defective display monitor 104 is repaired and replaced.

Accordingly, it may be desirable to have monitor protection system that can protect a display monitor against damage (e.g. from physical interaction), can be easily removed, can be replaced without damaging the display monitor or the protective panel, and can accommodate modern small-sized monitor bezels.

Figure 5:
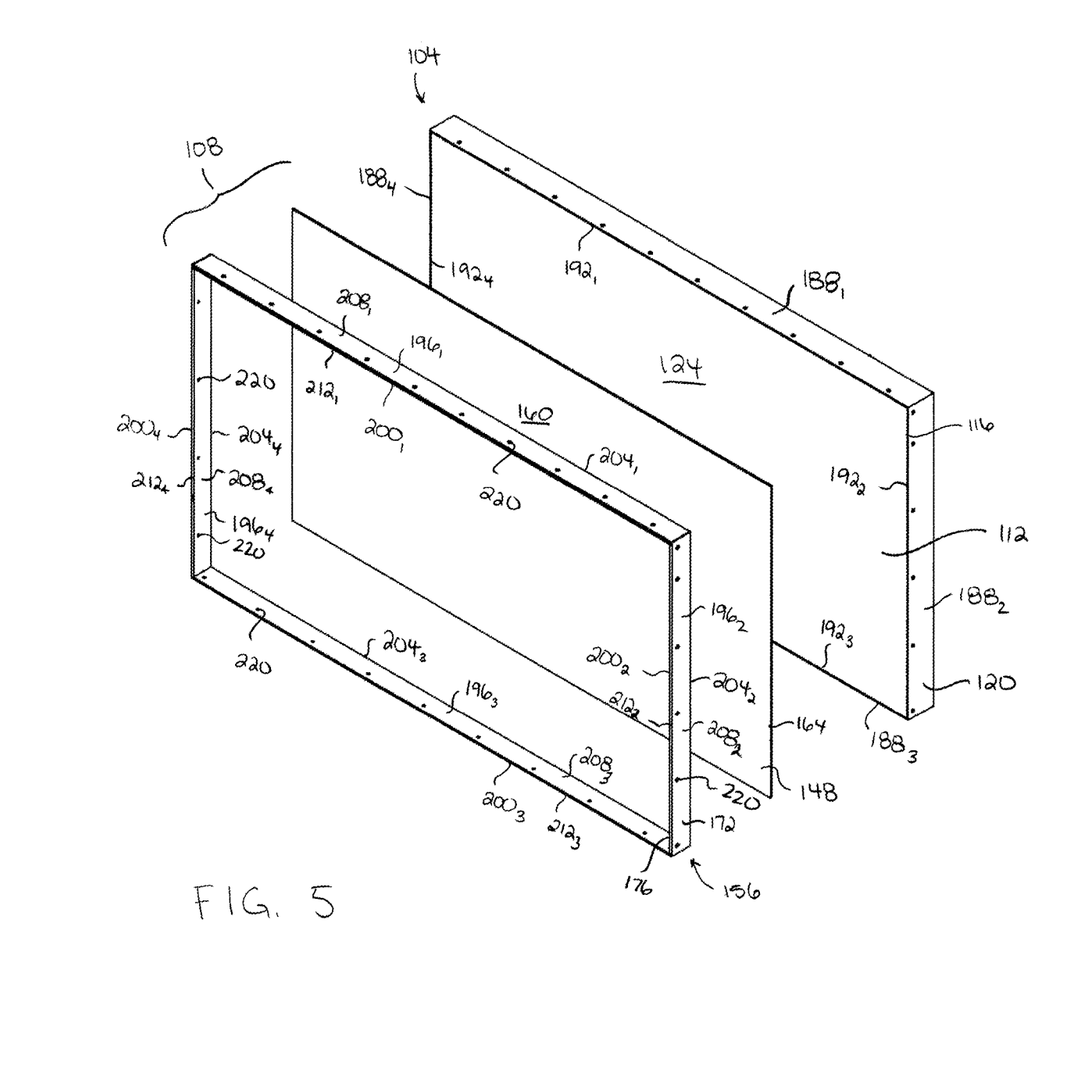
FIG. 5 is an exploded view of the protected display monitor of FIG. 2.
Figure 6:
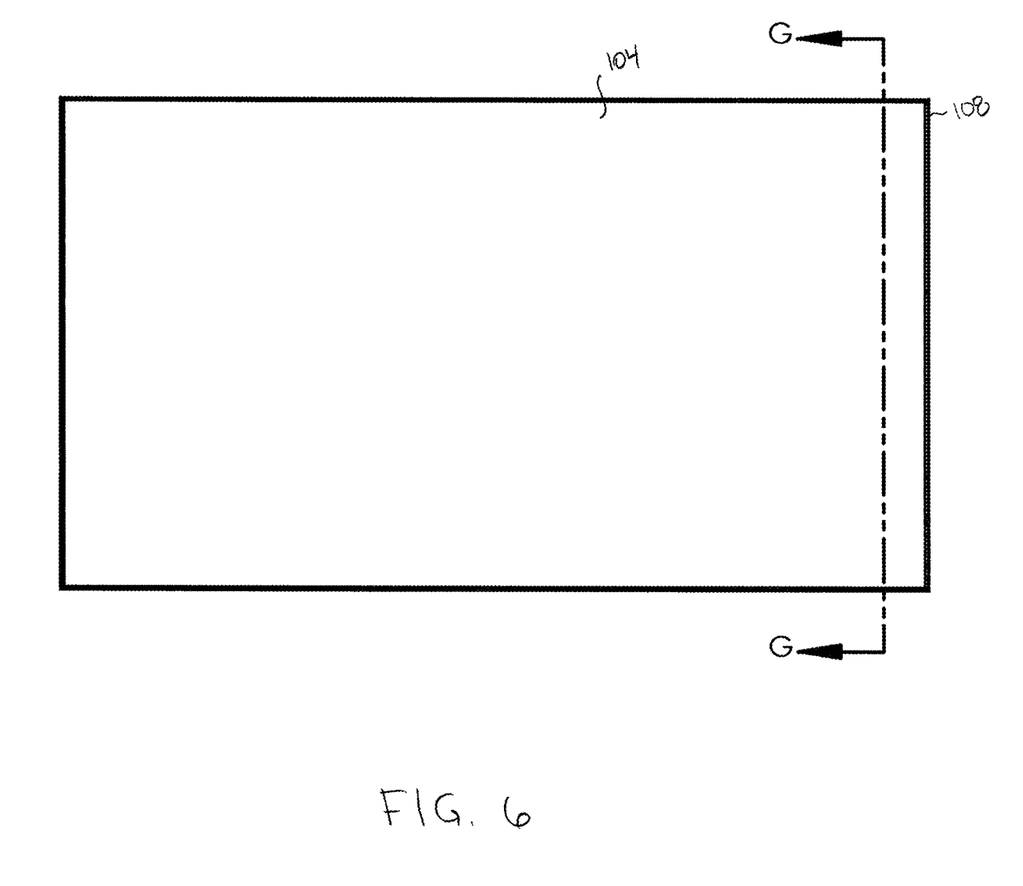
FIG. 6 is a front elevation view of a protected display monitor in accordance with another embodiment.
Figure 7:
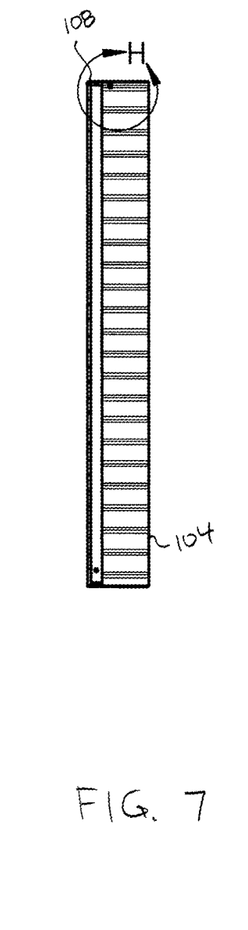
FIG. 7 is a cross-sectional view taken along line G-G in FIG. 6.

Reference is now made to FIGS. 4 and 5, which show a monitor protection system 108 in accordance with at least one embodiment. As shown, monitor protection system 108 may include a protective transparent panel 148, and a retention bezel 156. In use, the retention bezel 156 may be fastened to the monitor housing 120 to hold the protective transparent panel 148 over at least the screen viewing area 124 of display screen 112. Accordingly, monitor protection system 108 may not require mechanical fastening to the monitor bezel 116.

Protective transparent panel 148 may include an inner panel portion 160 surrounded by an outer peripheral panel portion 164. Inner panel portion 160 may have a panel area equal to the screen viewing area 124. For example, inner panel portion 160 may have the same size and shape as screen viewing area 124. As shown, inner panel portion 160 may overlay screen viewing area 124, and outer peripheral panel portion 164 may extend outwardly of inner panel portion 160 to overlay monitor bezel 116. As used herein and in the claims, a first element is said to "overlay" a second element where the first element overlays at least a portion of the second element, unless specifically specified otherwise.

Protective transparent panel 148 may be made of any suitable transparent material. For example, panel 148 may be made of glass or plastic (e.g. acrylic). Preferably, panel 148 is made of glass. In contrast, a plastic (e.g. acrylic) panel may sag unless made overly thick, and the acrylic may yellow over time. Also, flexible acrylic panels that clip onto monitors typically significantly increase the outer dimensions of the monitor, which make such clip-on acrylic panels unsuitable for a display wall. Further, protective transparent panel 148 may have any suitable panel thickness 168. For example, transparent panel 148 may be up to 0.25 inches thick, such as about ⅛ inch to about 5/32 inch thick.

Retention bezel 156 may include a mounting portion 172 and a front flange portion 176. As shown, mounting portion 172 may extend rearwardly from a mounting portion front end 178 to overlay monitor housing 120. Mounting portion 172 may be sized to encircle protective panel 148 and monitor housing 120. For example, mounting portion 172 may extend around the complete perimeter of both protective panel 148 and monitor housing 120.

Front flange portion 176 may extend inwardly from mounting portion front end 178 to overlay outer peripheral panel portion 164. As shown, front flange portion 176 may be wholly positioned outwardly of inner panel portion 160 so as not to obstruct screen viewing area 124. As shown, front flange portion 176 may extend around the complete perimeter of inner panel portion 160. This may permit retention bezel 156 to enclose protective panel 148 against display monitor 104 for protection.

Front flange portion 176 may have an inward bezel flange width 180 of less than or equal to inward monitor bezel width 140. For example, inward bezel flange width 180 may be 5 mm or less, such as 0.1 mm to 5 mm, 0.1 mm to 3 mm, or less than 3 mm. In some embodiments, front flange portion 176 may have an inward bezel flange width 180 that varies along the peripheral extent of front flange portion 176. For example, some models of display monitors 104 have a monitor bezel width 140 that varies along the peripheral extent of the monitor bezel 116. Front flange portion 176 may be sized accordingly.

The space between adjacent protected display monitors 104 in a display wall may be at least the material thickness 184 of the mounting portions 172 of their respective retention bezels 156. Accordingly, it may be desirable to minimize the bezel material thickness 184 so as not to frustrate the very benefit the OEM intended for the narrow monitor bezel width 140. In some embodiments, bezel material thickness 184 is 5 mm or less, such as 0.1 mm to 5 mm, less than 3 mm, less than 2 mm, or less than 1 mm.

Referring to FIG. 5, display monitor 104 may be substantially rectangular. As shown, monitor housing 120 may be substantially rectangular having four connected housing sides $188_1$, $188_2$, $188_3$, and $188_4$. Each housing side 188 may extend rearwardly from a respective one of four connected monitor bezel sides $192_1$, $192_2$, $192_3$, and $192_4$.

Retention bezel 156 may have the same shape as monitor housing 120. For example, retention bezel 156 may be substantially rectangular. As shown, retention bezel 156 may have four connected mounting portion sides $196_1$, $196_2$, $196_3$, and $196_4$. A respective one of four front flange portion sides $200_1$, $200_2$, $200_3$, and $200_4$ may extend inwardly from each mounting portion side 196. Each connected mounting portion side 196 may extend rearwardly to overlay a respective one of housing sides 188.

Still referring to FIG. 5, retention bezel 156 may include a plurality of discrete retention bezel segments 204. In the illustrated example, retention bezel 156 includes four linear retention bezel segments $204_1$, $204_2$, $204_3$, and $204_4$. Each retention bezel segment 204 may include a corresponding mounting portion segment $208_1$, $208_2$, $208_3$, or $208_4$ integrally formed with a front flange portion segment $212_1$, $212_2$, $212_3$, or $212_4$. For example, each retention bezel segment 204 may be linear and formed from a planar sheet of material (e.g. sheet metal) mechanically bent to define a front flange portion segment 212 and a mounting portion segment 208. As shown in FIG. 4, front flange portion 176 may be bent approximately 90 degrees inwardly from mounting portion 172.

Returning to FIG. 5, in the illustrated embodiment, each retention bezel segment 204 may define a mounting portion side 196 and a front flange portion side 200. Alternatively, or in addition, a plurality of retention bezel segments 204 may cooperatively define a pair of sides 196 and 200, or one retention bezel segment 204 may define more than one pair of sides 196 and 200.

Referring to FIG. 4, mounting portion 172 may be fastened to monitor housing 120 in any suitable fashion. As shown, mounting portion 172 may be fastened to monitor housing by mechanical fasteners, such as screws 216. Screws 216 may be inserted inwardly through mounting portion 172 into monitor housing 120. Turning to FIG. 5, mounting portion 172 may include a plurality of fastener apertures 220 for receiving mechanical fasteners (e.g. screws 216). Fastener apertures 220 may be distributed about mounting portion 172 so that at least one fastener aperture 220 aligns with each of at least two of housing sides 188. This may permit mounting portion 172 to be securely fastened to monitor housing 120 in a manner that resists pivoting, rotating, or swinging open. In the illustrated embodiment, fastener apertures 220 are distributed about mounting portion 172 so that at least one fastener aperture 220 aligns with each of (e.g. all four of) housing sides 188 as shown. This may permit mounting portion 172 to be securely connected to every housing side 188 which may provide a tight seal between mounting portion 172 and monitor housing 120.

Reference is now made to FIGS. 6-10, which illustrate an embodiment of protection system 108 including a spacer 224 for compatibility of certain touch-screen display screens 112 (e.g. projected capacitive touch screen displays). The spacer 224 may maintain a suitable separation between transparent panel 148 and touch screen 112 to allow touch interaction on transparent panel 148 to be properly received by touch screen 112.

Figure 8:
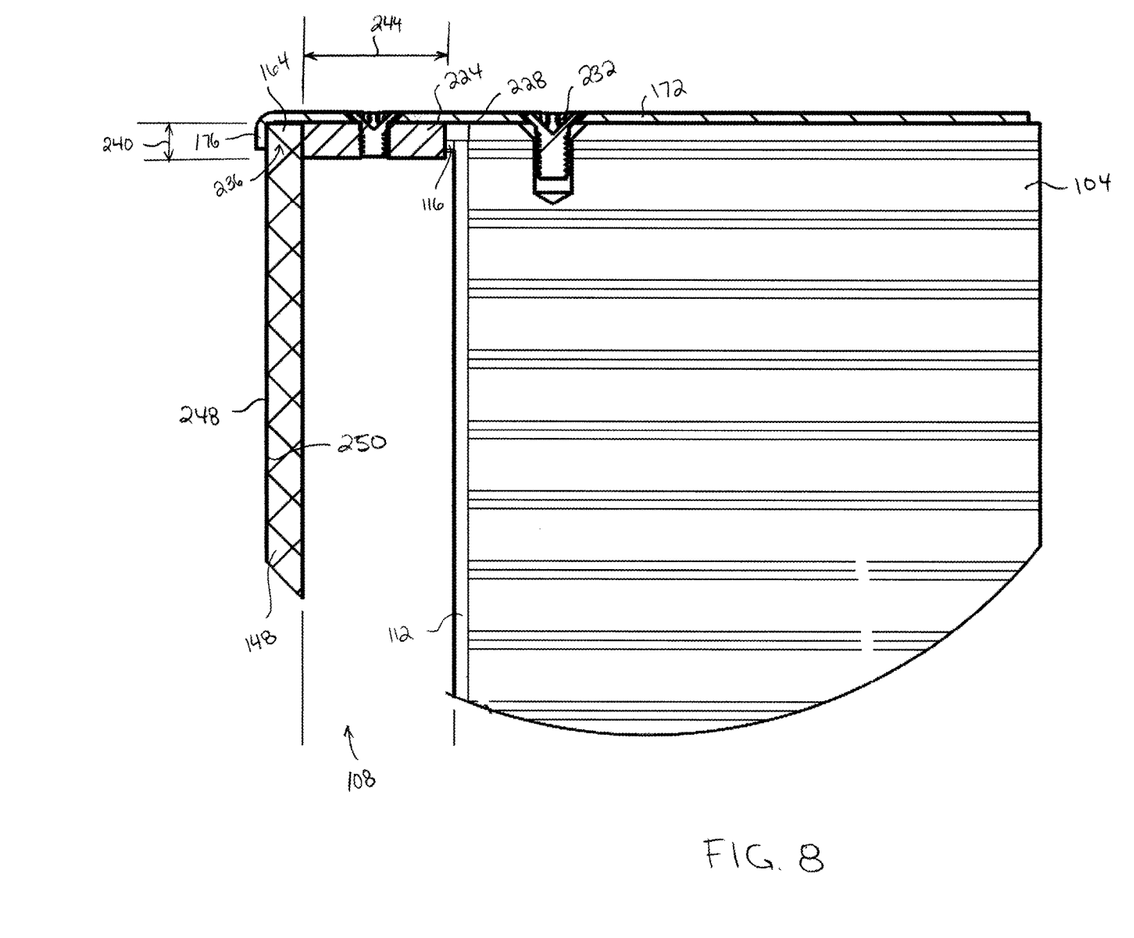
FIG. 8 is an enlarged view of region H in FIG. 7.
Figure 9:
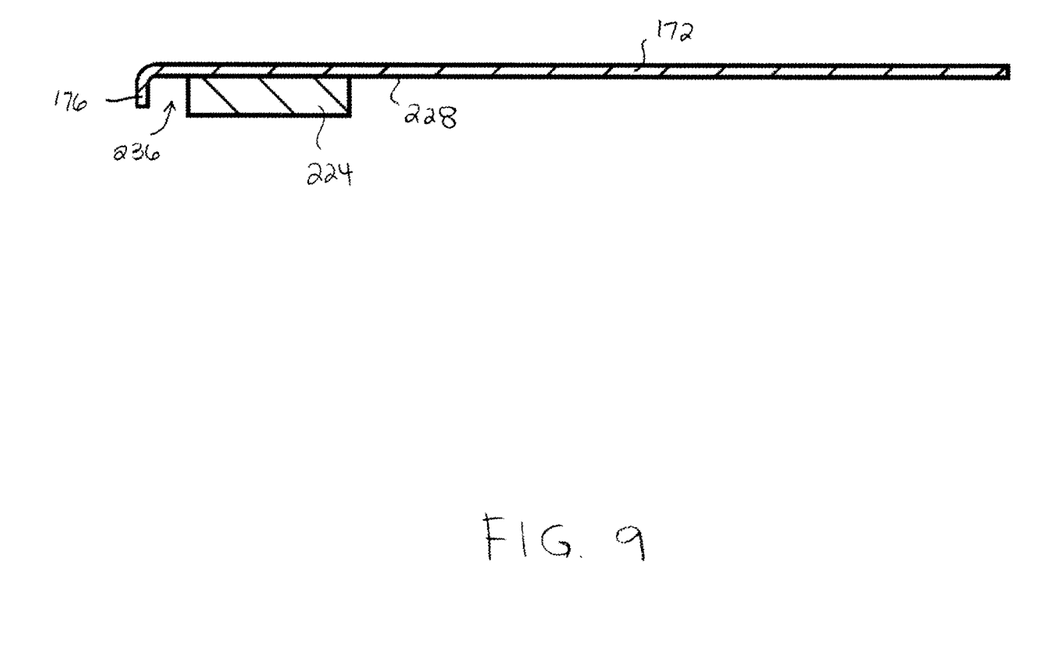
FIG. 9 is an enlarged view of a retention bezel of FIG. 7.

Referring to FIGS. 8 and 9, spacer 224 may be a strip of material connected to an inside face 228 of mounting portion 172. Spacer 224 may be connected to mounting portion 172 in any suitable manner such as by fasteners (e.g. screws 232), welds, or by integrally forming spacer 224 with mounting portion 172. As shown, spacer 224 may be positioned rearwardly of front flange portion 176 so that transparent panel 148 may be positioned between front flange portion 176 and spacer 224. In the illustrated embodiment, front flange portion 176 and spacer 224 define a retention slot 236 that receives outer peripheral panel portion 164. For example, the portion of protective panel 148 in retention slot 236 may abut spacer 224 and front flange portion 176.

Figure 10:
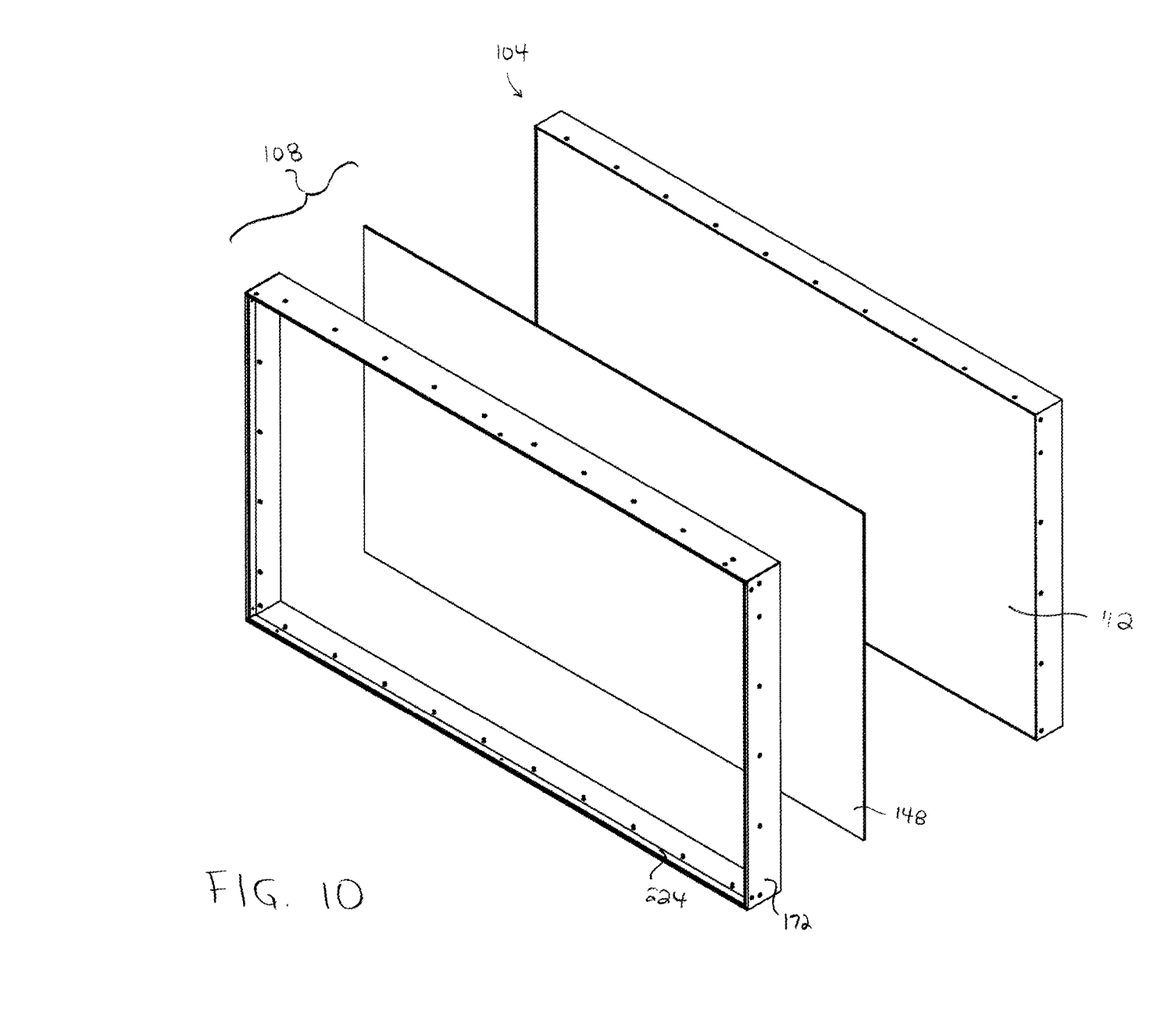
FIG. 10 is an exploded view of the protected display monitor of FIG. 6.

Referring to FIG. 8, spacer 224 may have an inward spacer width 240 sized so as not to obstruct screen viewing area 124. For example, inward spacer width 240 may be 5 mm or less, such as 0.1 mm to 5 mm, 0.1 mm to 3 mm, or less than 3 mm. This may permit spacer 224 to overlay monitor bezel 116 and be wholly positioned outwardly of screen viewing area 124. Spacer 224 may have a rearward spacer depth 244 selected for compatibility with touch screen 112. For example, spacer depth 244 may be between 6 mm and 48 mm, such as between 8 mm and 16 mm, or between 8 mm and 12 mm. Referring to FIG. 10, spacer 224 may extend continuously along the full peripheral extent of mounting portion 172 as shown, or spacer 224 may extend along on a portion of the peripheral extend of mounting portion 172.

Returning to FIG. 8, in some embodiments, a conductive film 248 is applied to panel front face 250. The conductive film 248 may help to create a capacitive field in response to touch. Touch screen 112 may detect the capacitive field as indicative of touch interaction. Thus, the conductive film 248 may permit touch screen 112 to respond to touch interaction with panel front face 250. In other embodiment, the material of transparent panel 148 and/or the touch screen technology of display screen 112 does not require transparent panel 148 to have a conductive film 248 applied to panel front face 250.

While the above description provides examples of the embodiments, it will be appreciated that some features and/or functions of the described embodiments are susceptible to modification without departing from the spirit and principles of operation of the described embodiments. Accordingly, what has been described above has been intended to be illustrative of the invention and non-limiting and it will be understood by persons skilled in the art that other variants and modifications may be made without departing from the scope of the invention as defined in the claims appended hereto. The scope of the claims should not be limited by the preferred embodiments and examples, but should be given the broadest interpretation consistent with the description as a whole.

The invention claimed is:

1. A system for protecting a display screen of a display monitor, the display screen having a screen viewing area, the display monitor including a monitor bezel encircling the screen viewing area, and a monitor housing extending rearwardly of the monitor bezel, the system comprising: a protective transparent panel having an inner panel portion surrounded by an outer panel portion, the inner panel portion having a panel area equal to the screen viewing area, the outer panel portion extending outwardly of the inner panel portion to overlay the monitor bezel; and a retention bezel having a mounting portion and a front flange portion, the mounting portion sized to encircle the protective transparent panel and the monitor housing, and the mounting portion extending rearwardly from a mounting portion front end to overlay the monitor housing, the front flange portion extending inwardly from the mounting portion front end to overlay the outer panel portion, the front flange portion being in contact with the outer panel portion, and the front flange portion having an inward width of between 0.1 mm and 5 mm, the mounting portion and the front flange portion having a material thickness of less than 5 mm; wherein the monitor housing is substantially rectangular with four connected housing sides, and the retention bezel is substantially rectangular, the mounting portion including four connected mounting portion sides sized to extend rearwardly over the four housing sides.

2. The system of claim 1, wherein: the mounting portion includes a plurality of fastener apertures collectively distributed to align with at least two of the four housing sides.

3. The system of claim 1, wherein:
the retention bezel further comprises a spacer connected to an inside face of the mounting portion and spaced rearwardly of the front flange.

4. The system of claim 3, wherein:
the spacer has a rearward depth of between 6 mm and 48 mm.

5. The system of claim 1, wherein:
the retention bezel further comprises a retention slot sized to receive the outer panel portion.

6. The system of claim 1, wherein:
the retention bezel comprises a plurality of linear retention bezel segments, and
each retention bezel segment includes a corresponding front flange portion segment integrally formed with a mounting portion segment.

7. The system of claim 6, wherein:
each retention bezel segment is formed from sheet metal, and
for each retention bezel segment, the front flange portion segment is bent approximately 90 degrees inwardly from the mounting portion segment.

8. A method of protecting a display screen of a display monitor, the display screen having a screen viewing area, the display monitor including a monitor bezel encircling the screen viewing area, and a monitor housing extending rearwardly of the monitor bezel, the method comprising: overlaying the display screen and the monitor bezel with a protective transparent panel, the transparent panel having an inner panel portion surrounded by an outer panel portion, the inner panel portion overlaying the entire screen viewing area, and the outer panel portion overlaying the monitor bezel; overlaying the monitor bezel, the outer panel portion, and the monitor housing with a retention bezel, the retention bezel having a mounting portion extending from a mounting portion front end rearwardly over the monitor housing, and a front flange portion, the mounting portion encircling the protective transparent panel and the monitor housing, the front flange portion extending inwardly from the mounting portion front end by between 0.1 mm to 5 mm to overlay the monitor bezel and the outer panel portion, the front flange portion being in contact with the outer panel portion, and the front flange portion positioned outwardly of the screen viewing area; and fastening the mounting portion to the monitor bezel, the retention bezel holding the protective transparent panel in position; wherein the monitor is substantially rectangular with four connected housing sides, and said fastening comprises inserting at least one fastener inwardly into each of the housing sides.

9. The method of claim 8, wherein:
the retention bezel further comprises a spacer defining a retention slot with the front flange portion, and
said overlaying the monitor bezel, the outer panel portion, and the monitor housing comprises receiving the outer panel portion in the retention slot.

10. The method of claim 9, further comprising:
inserting plurality of fasteners inwardly through the mounting portion into the spacer.

11. The method of claim 9, wherein:
said overlaying the monitor bezel, the outer panel portion, and the monitor housing comprises abutting the monitor bezel with the spacer.

12. The method of claim 8, wherein:
the monitor housing is substantially rectangular with four connected housing sides, and
said overlaying the monitor bezel, the outer panel portion, and the monitor housing comprises overlaying each of the housing sides with the mounting portion.

13. A display wall comprising: a plurality of display monitors arranged side-by-side in abutting relation, each display monitor having a screen viewing area, a monitor bezel encircling the screen viewing area, and a monitor housing extending rearwardly of the monitor bezel; and a plurality of monitor protection systems, each monitor protection system mounted to a respective one of the plurality of display monitors, each display monitor protection system comprising: a protective transparent panel having an inner panel portion surrounded by an outer panel portion, the inner panel portion overlaying the entire screen viewing area of the respective display monitor, the outer panel portion overlaying the monitor bezel; and a retention bezel having a mounting portion extending from a mounting portion front end rearwardly over the monitor housing of the respective display monitor, and a front flange portion, the mounting portion encircling the protective transparent panel and the mounting monitor housing of the respective display monitor, the front flange portion extending inwardly 0.1 mm to 5 mm from the mounting portion front end over the outer panel portion, the front flange portion being in contact with the outer panel portion, and the front flange portion positioned outwardly of the screen viewing area, the mounting portion and the front flange portion having a material thickness of less than 5 mm, the retention bezel holding the protective transparent panel in position, the monitor bezel of each display monitor is substantially rectangular with four connected housing sides, and the retention bezel of each monitor protection system is substantially rectangular, the mounting portion including four connected mounting portion sides sized to extend rearwardly over the four housing sides of the respective display monitor.

14. The system of claim 13, wherein: the mounting portion of the retention bezel of each monitor protection system includes a plurality of fastener apertures collectively distributed to align with at least two of the four housing sides of the respective display monitor.

15. The system of claim 13, wherein:

each display monitor comprises a projected capacitive touch screen, and the retention bezel of each monitor protection system further comprises a spacer separating the protective transparent panel of that monitor protection system from the projective capacity touch screen of the respective display monitor.

16. The system of claim 15, wherein:

the spacer has a rearward depth of between 6 mm and 48 mm.

17. The system of claim 13, wherein:

the retention bezel of each monitor protection system comprises a plurality of linear retention bezel segments, and each retention bezel segment includes a corresponding front flange portion segment integrally formed with a mounting portion segment.

* * * * *